(12) United States Patent
Ahn et al.

(10) Patent No.: US 7,944,772 B2
(45) Date of Patent: May 17, 2011

(54) SEMICONDUCTOR MEMORY DEVICE AND METHOD FOR GENERATING OUTPUT ENABLE SIGNAL

(75) Inventors: Jeong-Yoon Ahn, Gyeonggi-do (KR); Beom-Ju Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 191 days.

(21) Appl. No.: 12/345,918

(22) Filed: Dec. 30, 2008

(65) Prior Publication Data

US 2010/0109726 A1 May 6, 2010

(30) Foreign Application Priority Data

Nov. 6, 2008 (KR) .................. 10-2008-0110035

(51) Int. Cl.
*G11C 8/00* (2006.01)
(52) U.S. Cl. ............... 365/233.1; 365/191; 365/193; 365/194; 365/233.11; 365/233.12
(58) Field of Classification Search .......... 365/191, 365/193, 194, 233.1, 233.11, 233.12
See application file for complete search history.

(56) References Cited

U.S. PATENT DOCUMENTS

| 7,511,546 B2 * | 3/2009 | Koo | 327/261 |
| 7,561,490 B2 * | 7/2009 | Kim et al. | 365/233.11 |
| 7,672,191 B2 * | 3/2010 | Jang | 365/233.12 |

FOREIGN PATENT DOCUMENTS

| KR | 1020050041584 | 5/2005 |
| KR | 1020070056505 | 6/2007 |

OTHER PUBLICATIONS

Notice of Allowance issued from Korean Intellectual Property Office on Sep. 27, 2010.

* cited by examiner

*Primary Examiner* — Hoai V Ho
*Assistant Examiner* — Kretelia Graham
(74) *Attorney, Agent, or Firm* — IP & T Group LLP (57) ABSTRACT

A semiconductor memory device includes a DLL for detecting a phase difference between an external clock signal and a feedback clock signal to generate a delay control signal corresponding to the phase difference, and delaying the external clock signal by a delay amount corresponding to the delay control signal to generate a DLL clock signal; a clock counter reset signal generator for synchronizing an output enable reset signal with the external clock signal, delaying the synchronized signal by a delay amount corresponding to the delay control signal, and latching the delayed signal in response to the DLL clock signal to output a clock counter reset signal; and an output enable signal generator, reset in response to the clock counter reset signal, for counting the external clock signal and the DLL clock signal to generate an output enable signal corresponding to a read command and a CAS latency.

11 Claims, 6 Drawing Sheets

SEMICONDUCTOR MEMORY DEVICE AND METHOD FOR GENERATING OUTPUT ENABLE SIGNAL

CROSS-REFERENCE TO RELATED APPLICATIONS

The present invention claims priority of Korean patent application number 10-2008-0110035, filed on Nov. 6, 2008, which is incorporated by reference in its entirety.

BACKGROUND OF THE INVENTION

The present invention relates to a semiconductor design technology, and more particularly, to a semiconductor memory device for generating an output enable signal synchronized with an internal clock signal in response to a read command and Column Address Strobe (CAS) latency information.

In general, a semiconductor memory device, such as Double Data Rate Synchronous DRAM (DDR SDRAM), receives a read command from outside in response to an external clock signal during a read operation and outputs data stored therein to the outside in response to an internal clock signal. That is, in order to output data, the semiconductor memory device uses the internal clock signal, not the external clock signal. This read operation should involve an operation that synchronizes a read command signal synchronized with the external clock signal with the internal clock signal. Like the read command signal, the operation of synchronizing a signal synchronized with a certain clock signal with another clock signal is generally called "domain crossing".

Such a semiconductor memory device is provided with several circuits for performing a domain crossing operation, one of which is an output enable signal generation circuit. The output enable signal generation circuit domain crosses a read command signal, which is synchronized with an external clock signal and transferred, with an internal clock signal to output a domain crossed signal as an output enable signal. The output enable signal that has been so domain crossed contains CAS latency, and the semiconductor memory device uses the output enable signal to operate in a manner that data is synchronized with the external clock signal and then outputted at a desired time. Here, CAS latency has time information from a time when a read command is applied in one cycle unit of the external clock signal to a time when data is to be outputted.

Meanwhile, the semiconductor memory device is provided with an internal clock signal generation circuit for compensating for skew that may be generated by delay within the semiconductor memory device between the external clock signal and the internal clock signal. One of the representative elements in the internal clock signal generation circuit is a Delay Locked Loop (DLL). A DLL clock signal generated by a DLL will be used herein as an example internal clock signal.

Figure 1:
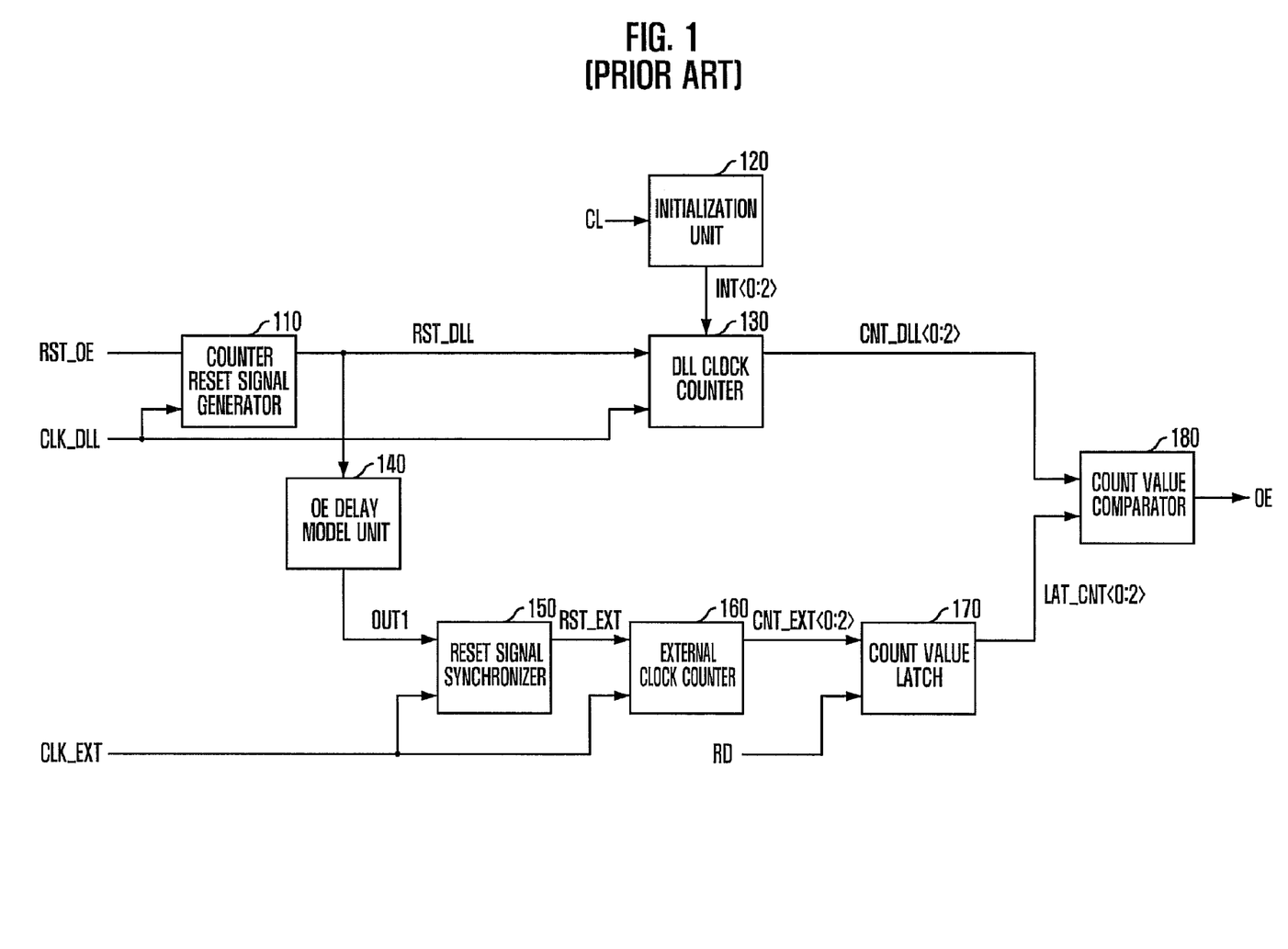
FIG. 1 is a block diagram illustrating a partial configuration of a conventional semiconductor memory device.

FIG. 1 is a block diagram describing a partial configuration of a conventional semiconductor memory device.

As shown, the conventional semiconductor memory device includes a counter reset signal generator 110, an initialization unit 120, a DLL clock counter 130, an output enable (OE) delay model unit 140, a reset signal synchronizer 150, an external clock counter 160, a count value latch 170, and a count value comparator 180.

The counter reset signal generator 110 synchronizes an output enable reset signal RST_OE with a DLL clock signal CLK_DLL to generate a DLL clock counter reset signal RST_DLL. Here, the output enable reset signal RST_OE is activated by decoding a chip select signal /CS as an external command signal, a row address strobe signal /RAS and a column address strobe signal /CAS, or activated at a completion time of locking operation of a DLL. In general, the counter reset signal generator 110 is composed of a D flip-flop that receives the output enable reset signal RST_OE and outputs it as the DLL clock counter reset signal RST_DLL in response to the DLL clock signal CLK_DLL.

The initialization unit 120 provides the DLL clock counter 130 with an initial count value corresponding to CAS latency CL. That is, the initialization unit 120 sets up the initial count value of the DLL clock counter 130 as output signals INT<0:2> corresponding to the CAS latency CL.

The DLL clock counter 130 is reset in response to the DLL clock counter reset signal RST_DLL and counts the DLL clock signal CLK_DLL from the initial count value corresponding to the output signals INT<0:2> from the initialization unit 120. That is to say, the DLL clock counter 130 generates DLL clock count values CNT_DLL<0:2> that are obtained by counting the DLL clock signal CLK_DLL from the initial count value set up based on the CAS latency CL.

The OE delay model unit 140 models a delay difference value between an external clock signal CLK_EXT used by a domain crossing circuit and the DLL clock signal CLK_DLL to generate an output signal OUT1 by delaying the DLL clock counter reset signal RST_DLL by an asynchronous delay time.

The reset signal synchronizer 150 synchronizes the output signal OUT1 from the OE delay model unit 140 with the external clock signal CLK_EXT to generate an external clock counter reset signal RST_EXT.

The external clock counter 160 is reset in response to the external clock counter reset signal RST_EXT, counts the external clock signal CLK_EXT, and outputs external clock count values CNT_EXT<0:2>. Generally, the external clock counter 160 establishes its initial count value as 0.

The count value latch 170 latches the external clock count values CNT_EXT<0:2> output from the external clock counter 160 in response to a read command RD to output latched external clock count values LAT_CNT<0:2>.

The count value comparator 180 compares the DLL clock count values CNT_DLL<0:2> with the latched external clock count values LAT_CNT<0:2> and activates an output enable signal OE at a time when the two values become the same. Here, the output enable signal OE is synchronized with the DLL clock signal CLK_DLL and contains CAS latency CL information. For reference, the output enable signal OE is used to output plural internal data by adding burst length information thereto thereafter.

Meanwhile, the output enable reset signal RST_OE is generated and provided from a slightly remote part of the above configuration. This allows for occurrence of skew by any variation in process, voltage, and temperature, while the output enable reset signal RST_OE is transferred to the counter reset signal generator 110. This skew of the output enable reset signal RST_OE can cause malfunctioning of the counter reset signal generator 110.

Figure 2:
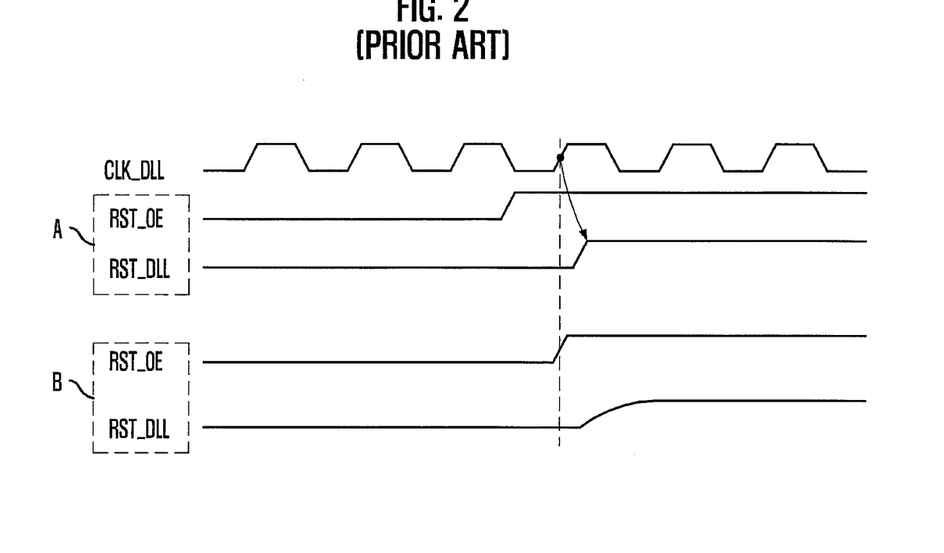
FIG. 2 is a waveform diagram describing an operation waveform when there is the occurrence of skew of an output enable reset signal shown in FIG. 1.

FIG. 2 is a waveform diagram showing an operation waveform when there is occurrence of skew of the output enable reset signal RST_OE shown in FIG. 1. As noted above, the counter reset signal generator 110 is composed of one D flip-flop. In FIG. 2, 'A' represents when the counter reset signal generator 110 performs a normal operation and 'B' represents when it performs an abnormal operation.

As shown, in case of A, the output enable reset signal RST_OE has a sufficient setup time with respect to a rising edge of the DLL clock signal CLK_DLL. Because of this, the DLL clock counter reset signal RST_DLL is synchronized with the DLL clock signal CLK_DLL and then outputted.

In case of B, the output enable reset signal RST_OE does not have a sufficient setup time with respect to a rising edge of the DLL clock signal CLK_DLL. Because of this, the DLL clock counter reset signal RST_DLL is not synchronized exactly with the DLL clock signal CLK_DLL. In this case, the DLL clock counter reset signal RST_DLL cannot exactly control an operation timing of the DLL clock counter 130 (see FIG. 1). Thus, in order to resolve this problem, the counter reset signal generator 110 has been recently configured as shown in FIG. 3.

Figure 3:
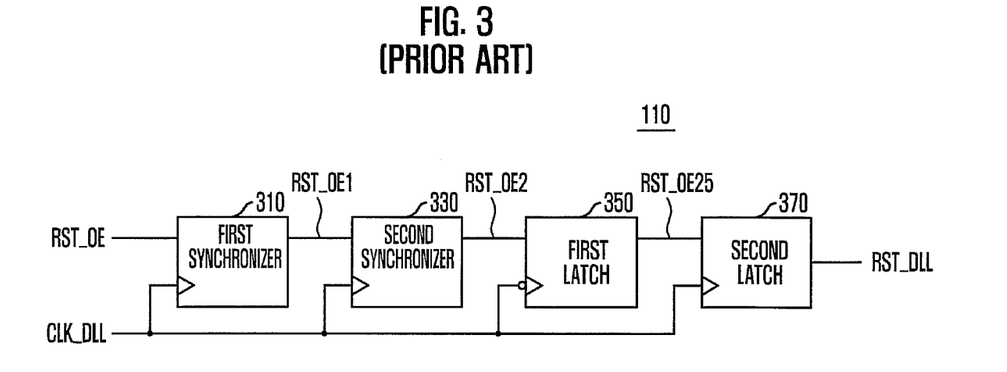
FIG. 3 is a detailed block diagram illustrating a counter reset signal generator shown in FIG. 1.

FIG. 3 is a detailed block diagram describing the counter reset signal generator 110 shown in FIG. 1.

As shown, the counter reset signal generator 110 includes first and second synchronizers 310 and 330, and first and second latches 350 and 370. Here, each of the first and the second synchronizers 310 and 330 is composed of a D flip-flop, and each of the first and the second latches 350 and 370 is composed of a latch element.

The first synchronizer 310 synchronizes an output enable reset signal RST_OE with a DLL clock signal CLK_DLL to output a first synchronized signal RST_OE1 and the second synchronizer 330 synchronizes the first synchronized signal RST_OE1 with the DLL clock signal CLK_DLL to output a second synchronized signal RST_OE2. The first latch 350 latches the second synchronized signal RST_OE2 in response to the DLL clock signal CLK_DLL to output a latched signal RST_OE25, and the second latch 370 latches the latched signal RST_OE25 to output a DLL clock counter reset signal RST_DLL in response to the DLL clock signal CLK_DLL.

Thus, as in B of FIG. 2, although a setup time problem of the output enable reset signal RST_DLL and the DLL clock signal CLK_DLL occurs in the first synchronizer 310, it is possible for the second synchronizer 330 prepared at a next stage of the first synchronizer 310 to perform a synchronization operation with the DLL clock signal CLK_DLL.

Figure 4:
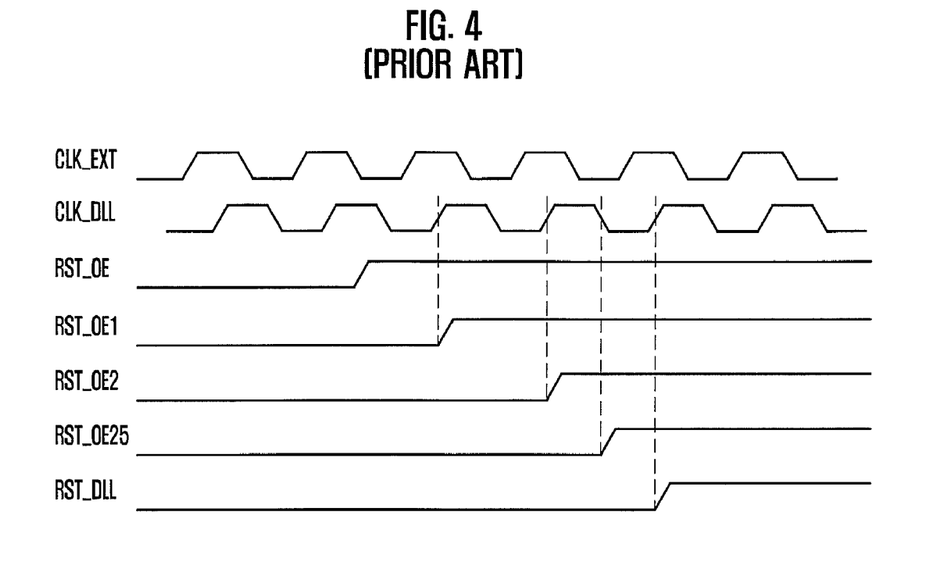
FIG. 4 is a timing diagram describing an operation timing of each signal used for the counter reset signal generator shown in FIG. 3.

FIG. 4 is a timing diagram describing an operation timing of each signal used for the counter reset signal generator 110 of FIG. 3.

Referring to FIGS. 3 and 4, the first synchronizer 310 synchronizes the activated output enable reset signal RST_OE with a rising edge of the DLL clock signal CLK_DLL to generate the first synchronized signal RST_OE1, and the second synchronizer 330 synchronizes the first synchronized signal RST_OE1 from the first synchronizer 310 with a rising edge of the DLL clock signal CLK_DLL once again to provide the second synchronized signal RST_OE2. The first latch 350 latches the second synchronized signal RST_OE2 from the second synchronizer 330 in response to a falling edge of the DLL clock signal CLK_DLL to output the latched signal RST_OE25, and the second latch 370 latches the latched signal RST_OE25 to output the DLL clock counter reset signal RST_DLL in response to a rising edge of the DLL clock signal CLK_DLL.

As such, the DLL clock counter reset signal RST_DLL is used to determine a counting operation timing of the DLL clock counter 130 shown in FIG. 1. In addition, the DLL clock counter reset signal RST_DLL becomes a source signal of the external clock counter reset signal RST_EXT that determines a counting operation timing of the external clock counter 160 through the OE delay model unit 140 and the reset signal synchronizer 150 in FIG. 1. In other words, the DLL clock counter reset signal RST_DLL acts as a critical factor to determine a counting operation timing of the DLL clock counter 130 and the external clock counter 160.

Meanwhile, the counting operation timing of the DLL clock counter 130 and the external clock counter 160 becomes a critical factor in determining the tRCD (RAS to CAS Delay) as defined in the specification. Here, tRCD defines when a read command is applied after an active operation, and is used as a factor to determine an operating speed of a semiconductor memory device. Typically, the DLL clock counter 130 and the external clock counter 160 have to perform a counting operation after completion of a reset operation before a read command is applied. In other words, if the DLL clock counter 130 and the external clock counter 160 have a delayed reset operation, a read command would be applied with its corresponding delay, thereby degrading tRCD characteristics by the same amount.

In such a configuration as the first and the second synchronizers 310 and 330 and the first and the second latches 350 and 370 in FIG. 3, there is the consumption of 3 tCK on the basis of the DLL clock signal CLK_DLL after the output enable reset signal RST_OE is activated, as in FIG. 4. That is, the DLL clock counter 130 consumes at least 3 tCK to perform a counting operation after reset. Considering the external clock counter 160 that performs a counting operation slower than the DLL clock counter 130, the read command should be applied after more than 3 tCK.

Meanwhile, as semiconductor memory devices are highly integrated, their internal circuits are designed under the design rule of less than submicron level, and as technologies are highly developed, an operating frequency of memory devices, also, increases gradually.

First, such high integration allows chip size of the semiconductor memory device to be decreased gradually, thereby increasing the number of semiconductor memory devices produced on one wafer. These semiconductor memory devices, so produced, undergo a variety of test modes before their mass-production as products. In order to perform such test modes, however, high-price test equipment is required.

Next, in recent circumstances where an operating frequency continues to increase, it is preferable to use test equipment that can support the same frequency so as to test the semiconductor memory devices under optimum environments. However, since such test equipment is very expensive, there is inevitably a burden to purchase test equipments for different operating frequencies. Thus, in the test modes, various tests are carried out by existing test equipment by applying a test clock signal with a lower frequency than an operating frequency in normal mode to the semiconductor memory devices, wherein the test clock signal is supported by the test equipment.

Meanwhile, since the time being consumed in the test modes is related directly to the production cost of the semiconductor memory device, endeavors have been made to reduce the time. For an existing semiconductor memory device, time corresponding to at least 3 tCK is taken to generate the DLL clock counter reset signal RST_DLL. Also, in the test modes, the same situation is present, which means that 3 tCK is very long in the test clock signal of relatively low frequency. That is to say, this causes a prolonged test time by the same amount. The prolonged test time as such increases the production cost, which lowers the competitiveness of producing semiconductor memory devices.

SUMMARY OF THE INVENTION

An embodiment of the present invention is directed to providing a semiconductor memory device, which can adopt a delay amount reflected in a DLL, instead of using plural D flip-flops, to generate a clock counter reset signal.

Another embodiment of the present invention is directed to providing a semiconductor memory device, which can improve tRCD characteristics of semiconductor memory devices using a clock signal of relatively low frequency.

In accordance with an aspect of the present invention, there is provided a semiconductor memory device, which includes a Delay Locked Loop (DLL) for detecting a phase difference between an external clock signal and a feedback clock signal to generate a delay control signal corresponding to the phase difference, and delaying the external clock signal by a delay amount corresponding to the delay control signal to generate a DLL clock signal; a clock counter reset signal generator for synchronizing an output enable reset signal with the external clock signal, delaying the synchronized signal by a delay amount corresponding to the delay control signal, and latching the delayed signal in response to the DLL clock signal to output a clock counter reset signal; and an output enable signal generator, reset in response to the clock counter reset signal, for counting the external clock signal and the DLL clock signal to generate an output enable signal corresponding to a read command and a CAS latency.

In accordance with another aspect of the present invention, there is provided a method for generating an output enable signal, which includes synchronizing an output enable reset signal activated before a read command is applied with an external clock signal; delaying the synchronized signal by a delay amount of a Delay Locked Loop (DLL) clock signal with respect to the external clock signal; latching the delayed signal in response to the DLL clock signal; and generating an output enable signal corresponding to the read command and a CAS latency by counting the external clock signal and the DLL clock signal, which is reset in response to the latched signal.

The semiconductor memory device in accordance with the present invention utilizes diverse amounts of delay reflected in a DLL upon completion of locking operation in the DLL to generate a clock counter reset signal, thereby improving tRCD characteristics of semiconductor memory devices using a clock signal of relatively low frequency. Moreover, this improvement in tRCD characteristics enhances an overall operation speed of the semiconductor memory device.

DESCRIPTION OF SPECIFIC EMBODIMENTS

Hereinafter, the most preferred embodiment of the present invention will be described in detail with reference to the accompanying drawings so that the invention can easily be practiced by those skilled in the art to which the invention pertains.

Figure 5:
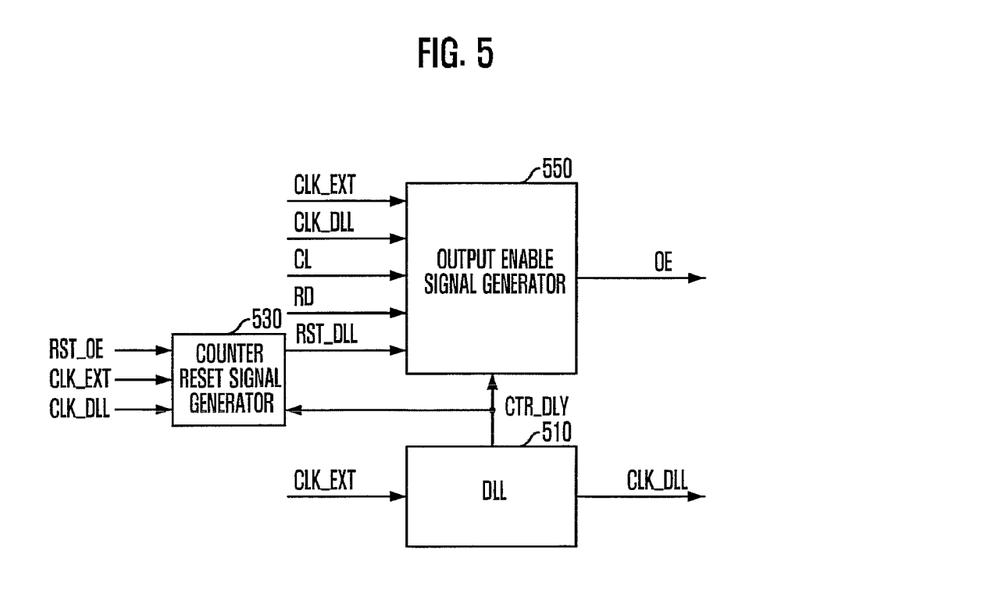
FIG. 5 is a block diagram illustrating a partial configuration of a semiconductor memory device in accordance with an embodiment of the present invention.

FIG. 5 is a block diagram illustrating a partial configuration of a semiconductor memory device in accordance with an embodiment of the present invention.

As shown, the semiconductor memory device includes a DLL 510, a counter reset signal generator 530, and an output enable signal generator 550.

The DLL 510 detects a phase difference between an external clock signal CLK_EXT and a feedback clock signal to generate a delay control signal CTR_DLY corresponding to the phase difference, and delays the external clock signal CLK_EXT by a delay amount corresponding to the delay control signal CTR_DLY to produce a DLL clock signal CLK_DLL. Here, the feedback clock signal is a clock signal that is obtained by reflecting an actual delay occurred in a clock/data path in the DLL clock signal, details of which will be described in detail in FIG. 6.

Figure 6:
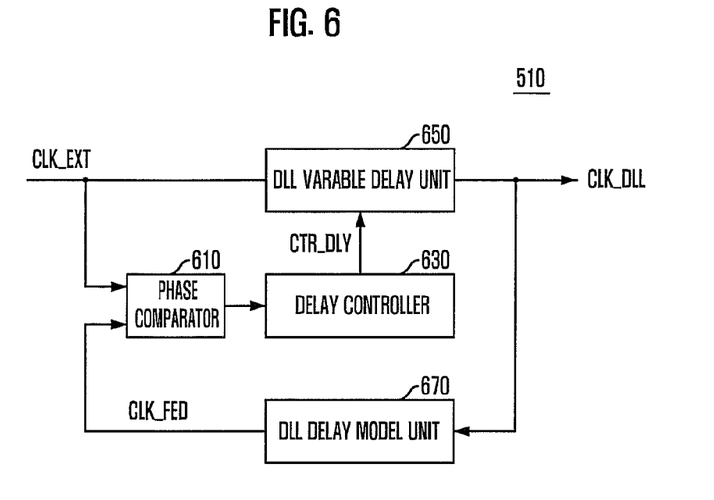
FIG. 6 is a detailed block diagram illustrating a DLL shown in FIG. 5.

FIG. 6 is a detailed block diagram illustrating the DLL 510 shown in FIG. 5.

As shown, the DLL 510 is provided with a phase comparator 610, a delay controller 630, a DLL variable delay unit 650, and a DLL delay model unit 670.

The phase comparator 610 serves to compare a phase of an external clock signal CLK_EXT with that of a feedback clock signal CLK_FED to output a signal corresponding to the comparison result.

The delay controller 630 generates a delay control signal CTR_DLY based on an output signal from the phase comparator 610. The semiconductor memory device in accordance with the present invention can provide the delay control signal CTR_DLY generated from the delay controller 630 to the output enable signal generator 550 (see FIG. 5).

The DLL variable delay unit 650 delays the external clock signal CLK_EXT by a delay amount corresponding to the delay control signal CTR_DLY to output a delayed clock signal as a DLL clock signal CLK_DLL. The DLL variable delay unit 650 can be provided with unit delay cells coupled in chain manner. In this case, the delay control signal CTR_DLY may be composed in plural to control the respective unit delay cells.

The DLL delay model unit 670 models a time when the external clock signal CLK_EXT is inputted inside and buffered and a time when the DLL clock signal CLK_DLL is transferred to a circuit that actually outputs data. It can also receive the DLL clock signal CLK_DLL, delay it by the modeled time, and output a delayed signal as the feedback clock signal CLK_FED. Here, the external clock signal CLK_EXT means the buffered clock signal.

Through the configuration as above, the DLL 510 can perform a locking operation that allows the phases of the external clock signal CLK_EXT and the feedback clock signal CLK_FED to be consistent with each other.

Referring back to FIG. 5, the counter reset signal generator 530 synchronizes the output enable reset signal RST_OE with the external clock signal CLK_EXT and delays this by a delay amount corresponding to the delay control signal CTR_DLY. Then, it synchronizes the delayed signal with the DLL clock signal CLK_DLL to generate a synchronized signal as the DLL clock counter reset signal RST_DLL.

Figure 7:
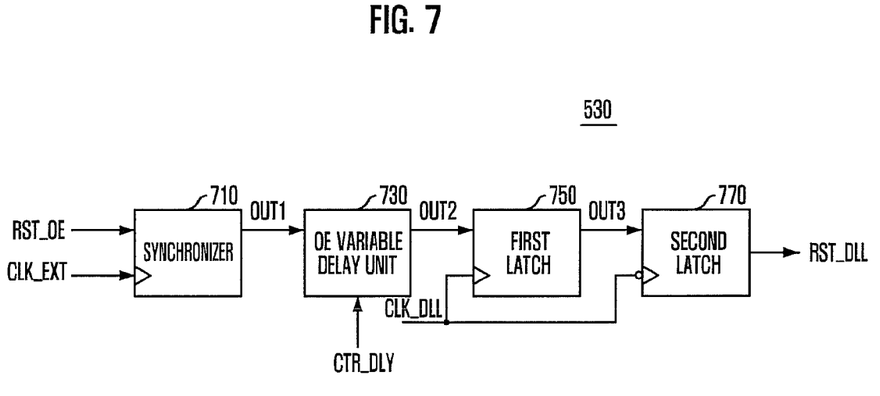
FIG. 7 is a detailed block diagram illustrating a first embodiment of a counter reset signal generator shown in FIG. 5.

FIG. 7 is a detailed block diagram illustrating a first embodiment of the counter reset signal generator 530 shown in FIG. 5.

As shown, the counter reset signal generator 530 is provided with a synchronizer 710, an OE variable delay unit 730, and first and second latches 750 and 770.

The synchronizer 710 synchronizes the output enable reset signal RST_OE with the external clock signal CLK_EXT to output a synchronized output signal OUT1. The synchronizer 710 is composed of a D flip-flop that operates in response to the external clock signal CLK_EXT.

The OE variable delay unit 730 delays the synchronized output signal OUT1 from the synchronizer 710 by a delay amount corresponding to the delay control signal CTR_DLY, thereby outputting a delayed output signal OUT2. The OE variable delay unit 730 is configured similarly to the DLL variable delay unit 650 in FIG. 6. That is, the OE variable delay unit 730 can be composed of plural unit delay cells that operate in response to the delay control signal CTR_DLY. Here, the delay amount of each of the plural unit delay cells constituting the OE variable delay unit 730 can be set differently depending on designs, but since the OE variable delay unit 730 does not need to be precisely controlled, unlike the DLL variable delay unit 650, it can be designed greater than the delay amount of each of the plural unit delay cells that constitute the DLL variable delay unit 650.

The first latch 750 latches the delayed output signal OUT2 from the OE variable delay unit 730 in repose to the DLL clock signal CLK_DLL to output a latched output signal OUT3. The second latch 770 latches the latched output signal OUT3 from the first latch 750 in response to the DLL clock signal CLK_DLL to output a latched signal as a DLL clock counter reset signal RST_DLL. Here, each of the first and the second latches 750 and 770 can be composed of a latch element that operates in response to the DLL clock signal CLK_DLL.

The semiconductor memory device in accordance with the present invention is different in configuration from the existing memory device in that it synchronizes the output enable reset signal RST_OE with the external clock signal CLK_EXT, not the DLL clock signal CLK_DLL, and delays the synchronized output signal OUT1 by a delay amount corresponding to the delay control signal CTR_DLY used by the DLL 510 (see FIGS. 5 and 6).

Figure 8:
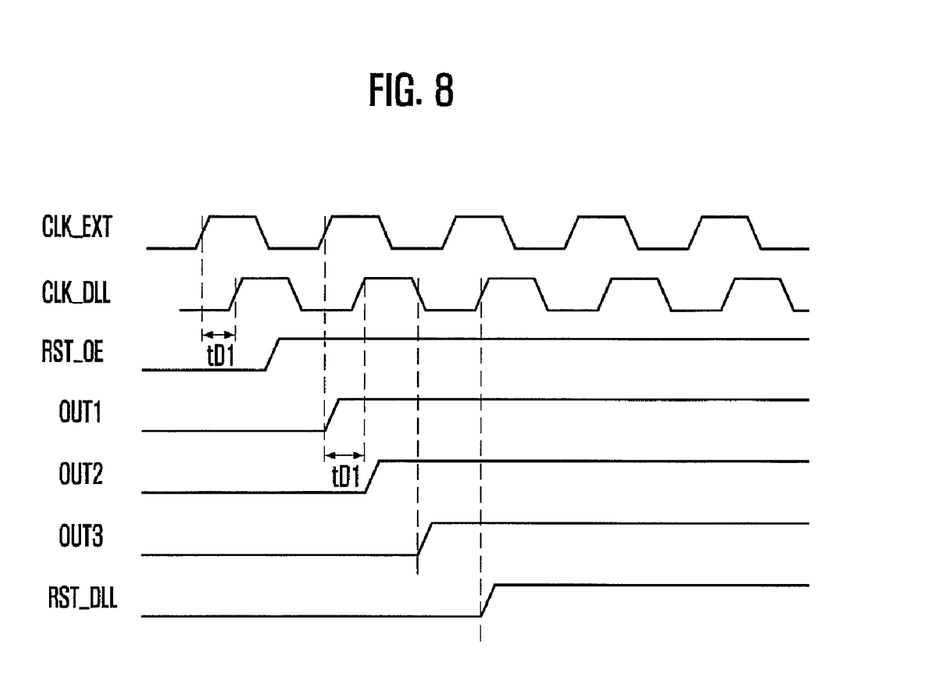
FIG. 8 is a timing diagram describing an operation timing of each signal used for the counter reset signal generator shown in FIG. 7.

FIG. 8 is a timing diagram describing an operation timing of each signal used for the counter reset signal generator 530 shown in FIG. 7.

Referring to FIGS. 7 and 8, the synchronizer 710 synchronizes the activated output enable reset signal RST_OE with a rising edge of the external clock signal CLK_EXT to generate the synchronized output signal OUT1. The OE variable delay unit 730 delays the synchronized output signal OUT1 from the synchronizer 710 by a delay amount tD1 corresponding to the delay control signal CTR_DLY to produce the delayed output signal OUT2. At this time, the delay amount tD1 corresponding to the delay control signal CTR_DLY can correspond to the DLL variable delay unit 650 (see FIG. 6). That is, the DLL variable delay unit 650 delays the external clock signal CLK_EXT to generate the DLL clock signal CLK_DLL, wherein a delay amount is tD1. The OE variable delay unit 730 in accordance with the present invention delays the synchronized output signal OUT1 from the synchronizer 710 by the delay amount tD1 to generate the delayed output signal OUT2, which can be smoothly latched at a desired time of the DLL clock signal CLK_DLL.

Next, the first latch 750 latches the delayed output signal OUT2 from the OE variable delay unit 730 in response to a falling edge of the DLL clock signal CLK_DLL. Here, the first latch 750 may perform a latching operation in response to a rising edge of the DLL clock signal CLK_DLL. As described above, the present invention illustrated that the latching is done in response to a falling edge of the DLL clock signal CLK_DLL, in consideration of timing margin of the delayed output signal OUT2 from the OE variable delay unit 730 and the DLL clock signal CLK_DLL. Then, the second latch 770 latches the latched output signal OUT3 from the first latch 750 in response to a rising edge of the DLL clock signal CLK_DLL to output a latched signal as the DLL clock counter reset signal RST_DLL.

As can be seen from a comparison between FIGS. 4 and 8, the time when the DLL clock counter reset signal RST_DLL in accordance with the present invention is synchronized with the DLL clock signal CLK_DLL is faster than the case of FIG. 4 of the prior art. Such DLL clock counter reset signal RST_DLL can make a counting operation time of the output enable generator 550 (see FIG. 5) more rapidly, which implies the characteristic improvement of tRCD that is the time when a read command is applied after an active operation. The improvement in tRCD characteristics can ensure a more rapid operation in a semiconductor memory device of relative low operating frequency or in test modes. It is, especially, possible to reduce a test time being consumed in the test modes, thereby reducing the production cost of the semiconductor memory device and improving the competitiveness of products.

Referring back to FIG. 5, the output enable signal generator 550 is reset in response to the DLL clock counter reset signal RST_DLL, and can count the external clock signal CLK_EXT and the DLL clock signal CLK_DLL to generate an output enable signal OE corresponding to a read command signal RD and CAS latency CL information. Here, the output enable signal generator 550 may be provided with the initialization unit 120, the DLL clock counter 130, the OE delay model unit 140, the reset signal synchronizer 150, the external clock counter 160, the count value latch 170, and the counter value comparator 180, as shown in FIG. 1. Since the components in the output enable signal generator 550 are identical to those of the prior art, details thereon will be omitted here.

Figure 9:
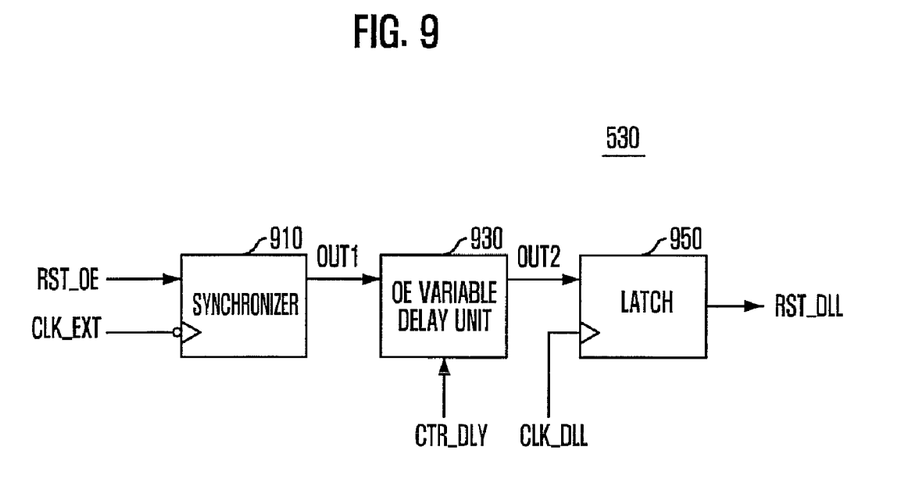
FIG. 9 is a detailed block diagram illustrating a second embodiment of a counter reset signal generator shown in FIG. 5.

FIG. 9 is a detailed block diagram illustrating a second embodiment of the counter reset signal generator 530 shown in FIG. 5.

Referring to FIG. 9, the counter reset signal generator 530 is provided with a synchronizer 910, an OE variable delay unit 930, and a latch 950.

The synchronizer 910 synchronizes the output enable reset signal RST_OE with the external clock signal CLK_EXT to output a synchronized output signal OUT1. In the first embodiment of FIG. 7, it can operate in response to a rising edge of the external clock signal CLK_EXT, and in the second embodiment, it can operate in response to a falling edge of the external clock signal CLK_EXT. In the present invention, since the output enable reset signal RST_OE is synchronized with the external clock signal CLK_EXT, no setup time problem occurs.

The OE variable delay unit 930 delays the synchronized output signal OUT1 from the synchronizer 910 by a delay amount corresponding to the delay control signal CTR_DLY, thereby outputting a delayed output signal OUT2. Since it is the same as that of the first embodiment, details thereon will be omitted here.

The latch 950 latches the delayed output signal OUT2 from the OE variable delay unit 930 in response to the DLL clock signal CLK_DLL. As mentioned above, the first embodiment used the two latches, while the second embodiment enables the use of only one latch 950 because the output enable reset signal RST_OE is synchronized with a falling edge of the external clock signal CLK_EXT.

Meanwhile, the OE variable delay units 730 and 930 of the first and the second embodiments are provided with plural unit delay cells, as described above. Each of the plural unit delay cells can be designed greater than the delay amount of each of the plural unit delay cells constituting the DLL variable delay unit 650 (see FIG. 6). That is, the number of the delay control signals CTR_DLY that control the OE variable delay units 730 and 930 may be smaller than that of delay control signals CTR_DLY that control the DLL variable delay unit 650.

Hereinafter, the delay control signal CTR_DLY that is inputted to the OE variable delay units 730 and 930 will be referred to as a sampling control signal CTR_SAM for convenience of explanation, which can be generated by a control signal sampling unit to be described below with reference to FIG. 10.

Figure 10:
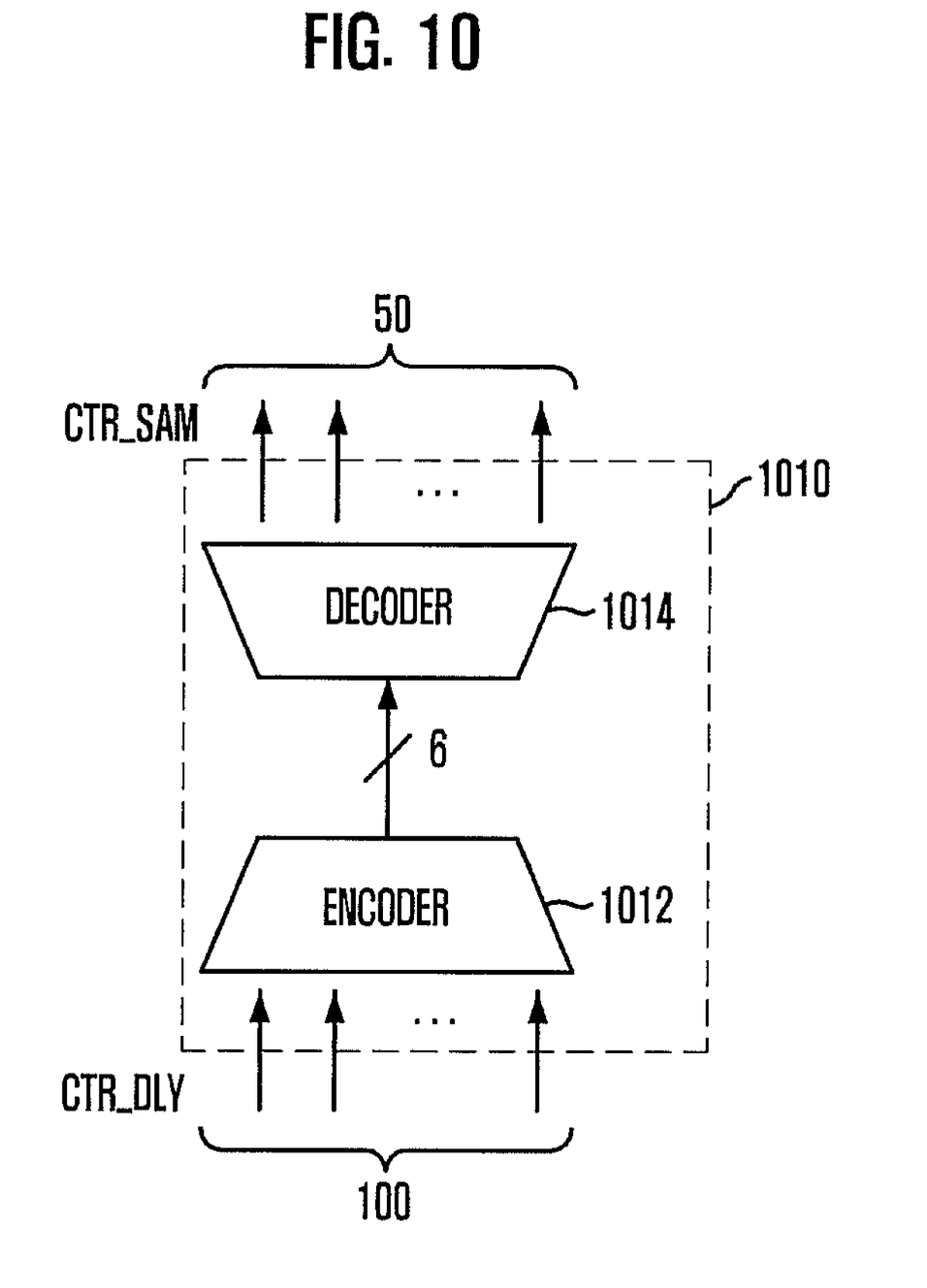
FIG. 10 is a block diagram of a control signal sampling unit to control a plurality of OE variable delay units shown in FIGS. 7 and 9.

FIG. 10 is a block diagram of a control signal sampling unit 1010 to control the OE variable delay units 730 and 930 shown in FIGS. 7 and 9.

Referring to FIG. 10, the control signal sampling unit 1010 is to sample plural delay control signals CTR_DLY outputted from the delay controller 630 (see FIG. 6) to generate plural sampling control signals CTR_SAM for controlling the OE variable delay units 730 and 930, and is provided with an encoder 1012 and a decoder 1014. Here, for convenience of explanation, it is assumed that the number of the plural delay control signals CTR_DLY is 100, the number of the sampling control signals CTR_SAM is 50, and an output signal after encoding of the 100 delay control signals CTR_DLY is of 6 bits.

Thus, the encoder 1012 receives and encodes 100 delay control signals CTR_DLY to generate a 6-bit output signal, and the decoder 1014 decodes the 6-bit output signal to generate 50 sampling control signals CTR_SAM. That is, the DLL variable delay unit 650 is provided with unit delay cells corresponding to the 100 delay control signals CTR_DLY for precise control in small unit time, and the OE variable delay units 730 and 930 are provided with unit delay cells corresponding to the 50 sampling control signals CTR_SAM for less precise control in larger unit time.

As described above, the semiconductor memory device in accordance with the present invention can synchronize the output enable reset signal RST_OE with an initial external clock signal CLK_EXT, and delay this synchronized signal by a time corresponding to a delay amount (tD1, see FIG. 8) of the DLL clock signal CLK_DLL with respect to the external clock signal CLK_EXT. Thereafter, the output signal so delayed can be smoothly latched in synchronism with the DLL clock signal CLK_DLL to generate the DLL clock counter reset signal RST_DLL more rapidly, thereby improving tRCD characteristics.

Although the above embodiment described the case of the test mode that uses a relatively low frequency by way of example, the present invention may also improve tRCD characteristics of a semiconductor memory device that uses a substantially low operating frequency.

As a result, the present invention can improve tRCD characteristics of a semiconductor memory device, thereby increasing an overall operation speed of the memory device.

In addition, the present invention can decrease the time being consumed in test mode that operates at a relatively low frequency, and thus can reduce the production cost of a semiconductor memory device and enhance the competitiveness of products.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a Delay Locked Loop (DLL) for detecting a phase difference between an external clock signal and a feedback clock signal to generate a delay control signal corresponding to the phase difference, and delaying the external clock signal by a delay amount corresponding to the delay control signal to generate a DLL clock signal;
    a clock counter reset signal generator for synchronizing an output enable reset signal with the external clock signal, delaying the synchronized signal by a delay amount corresponding to the delay control signal, and latching the delayed signal in response to the DLL clock signal to output a clock counter reset signal; and
    an output enable signal generator, reset in response to the clock counter reset signal, for receiving the external clock signal and the DLL clock signal to generate an output enable signal corresponding to a read command and a Column Address Strobe (CAS) latency.

2. The semiconductor memory device as recited in claim 1, wherein the clock counter reset signal generator includes:
    a synchronizer for synchronizing the output enable reset signal with the external clock signal;
    a variable delay unit for delaying an output signal of the synchronizer by the delay amount corresponding to the delay control signal; and
    a latch for latching an output signal of the variable delay unit in response to the DLL clock signal to output a latched signal as the clock counter reset signal.

3. The semiconductor memory device as recited in claim 2, further comprising a control signal sampling unit for sampling the delay control signal to generate and output a sampled delay control signal as the delay control signal for controlling the variable delay unit.

4. The semiconductor memory device as recited in claim 3, wherein the control signal sampling unit includes:
    an encoder for encoding the delay control signal; and
    a decoder for decoding an output signal of the encoder to generate and output the sampled delay control signal to the variable delay unit.

5. The semiconductor memory device as recited in claim 1, wherein the DLL includes:
    a phase comparator for comparing a phase of the external clock signal with that of the feedback clock signal;
    a delay controller for generating the delay control signal corresponding to an output signal of the phase comparator;
    a variable delay unit for delaying the external clock signal by a delay amount corresponding to the delay control signal to output the DLL clock signal; and
    a delay model unit for generating the feedback clock signal by reflecting an actual delay occurred in a clock/data path in the DLL clock signal.

6. The semiconductor memory device as recited in claim 1, wherein the output enable signal generator includes:
- a first counter, reset in response to the clock counter reset signal, for counting the DLL clock signal from an initial count value corresponding to the CAS latency
- a delay model unit for delaying the clock counter reset signal by a delay difference value between the external clock signal and the DLL clock signal;
- a synchronizer for synchronizing an output signal of the delay model unit with the external clock signal;
- a second counter, reset in response to an output signal of the synchronizer, for counting the external clock signal;
- a latch for latching an output value of the second counter in response to the read command; and
- a comparator for comparing an output value of the first counter with an output value of the latch to generate the output enable signal.

7. A method for generating an output enable signal, comprising:
- synchronizing an output enable reset signal activated before a read command is applied with an external clock signal;
- delaying the synchronized signal by a delay amount of a Delay Locked Loop (DLL) clock signal with respect to the external clock signal;
- latching the delayed signal in response to the DLL clock signal; and
- generating an output enable signal corresponding to the read command and a Column Address Strobe (CAS) latency by counting the external clock signal and the DLL clock signal, which is reset in response to the latched signal.

8. The method as recited in claim 7, wherein the delaying the synchronized signal is controlled depending on a delay control signal used during a locking operation of a DLL for generating the DLL clock signal.

9. The method as recited in claim 7, further comprising generating a sampled control signal as the delay control signal for controlling the delaying the synchronized signal by sampling the delay control signal.

10. The method as recited in claim 9, wherein the generating the sampling control signal includes:
- encoding the delay control signal; and
- decoding the encoded signal to output the sampled control signal.

11. The method as recited in claim 7, wherein the generating the output enable signal includes:
- counting the DLL clock signal from an initial count value corresponding to the CAS latency, which is reset in response to the latched signal;
- delaying the latched signal by a delay difference value between the external clock signal and the DLL clock signal, and synchronizing the delayed signal with the external clock signal to output a synchronized signal as a reset signal;
- counting the external clock signal in response to the reset signal, and latching a counted value of the external clock signal in response to the read command; and
- activating the output enable signal at a time when the latched counted value is equal to a counted value of the DLL clock signal.

* * * * *